United States Patent
Ye

(10) Patent No.: US 9,293,798 B2
(45) Date of Patent: Mar. 22, 2016

(54) CROSSTALK CANCELLATION AND/OR REDUCTION

(75) Inventor: Xiaoning Ye, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 14 days.

(21) Appl. No.: 13/976,780

(22) PCT Filed: Dec. 19, 2011

(86) PCT No.: PCT/US2011/065879
§ 371 (c)(1),
(2), (4) Date: Jun. 27, 2013

(87) PCT Pub. No.: WO2013/095335
PCT Pub. Date: Jun. 27, 2013

(65) Prior Publication Data
US 2013/0278348 A1   Oct. 24, 2013

(51) Int. Cl.
| | |
|---|---|
| *H01P 3/08* | (2006.01) |
| *H01P 1/22* | (2006.01) |
| *H04L 25/03* | (2006.01) |
| *H01R 13/6471* | (2011.01) |
| *H05K 1/02* | (2006.01) |
| *H01P 3/02* | (2006.01) |

(52) U.S. Cl.
CPC ............ *H01P 1/227* (2013.01); *H01R 13/6471* (2013.01); *H04L 25/03878* (2013.01); *H05K 1/0228* (2013.01); *H05K 1/0245* (2013.01); *H01P 3/026* (2013.01); *H05K 2201/09236* (2013.01); *H05K 2201/10189* (2013.01)

(58) Field of Classification Search
CPC ...................................................... H01P 3/081
USPC ............. 333/161, 164, 156, 5, 260, 1, 4, 238, 333/246; 439/676, 941
See application file for complete search history.

(56) References Cited

U.S. PATENT DOCUMENTS

| | | | |
|---|---|---|---|
| 7,102,455 B2 * | 9/2006 | Lin et al. ............................ 333/1 |
| 7,232,959 B2 * | 6/2007 | Hsu ............................... 174/261 |
| 7,887,379 B2 * | 2/2011 | Kirk .............................. 439/676 |
| 8,624,687 B2 * | 1/2014 | Ye ..................................... 333/5 |
| 2005/0077977 A1 | 4/2005 | Beale et al. |
| 2010/0093227 A1 | 4/2010 | Kirk |
| 2010/0184307 A1 | 7/2010 | Arai et al. |
| 2012/0275122 A1* | 11/2012 | Howard et al. ............... 361/748 |

FOREIGN PATENT DOCUMENTS

| | | |
|---|---|---|
| TW | I306009 B | 2/2009 |
| WO | 2013/095335 A1 | 6/2013 |

OTHER PUBLICATIONS

International Search Report and written Opinion received for PCT Patent Application No. PCT/US2011/065879, mailed on Sep. 25, 2012, 9 pages.

* cited by examiner

*Primary Examiner* — Dinh Le
(74) *Attorney, Agent, or Firm* — International IP Law Group, P.L.L.C.

(57) ABSTRACT

Some embodiments include a first differential signal pair and a second differential signal pair. The first and second differential signal pairs are arranged relative to each other in a manner to intentionally reduce or cancel crosstalk introduced by a pinout (for example, a section of a pinout, a socket, a connector, etc.) into at least one of the first differential signal pair and the second differential signal pair. Other embodiments are described and claimed.

22 Claims, 6 Drawing Sheets

CROSSTALK CANCELLATION AND/OR REDUCTION

TECHNICAL FIELD

The inventions generally relate to crosstalk cancellation and/or to crosstalk reduction.

BACKGROUND

Crosstalk has become a critical factor in limiting Input/Output (I/O) performance in computing systems. This is particularly true in the case of using a differential bus. Sockets and connectors have become two of the most dominant crosstalk contributors, particularly in server systems.

There are no good current solutions to this problem. In general, the computing platform has to tolerate the existing crosstalk level for the socket and/or connector. This typically results in degraded performance or reduced routing length of the differential bus.

BRIEF DESCRIPTION OF THE DRAWINGS

The inventions will be understood more fully from the detailed description given below and from the accompanying drawings of some embodiments of the inventions which, however, should not be taken to limit the inventions to the specific embodiments described, but are for explanation and understanding only.

DETAILED DESCRIPTION

Some embodiments of the inventions relate to crosstalk cancellation and/or to crosstalk reduction.

Some embodiments include a first differential signal pair and a second differential signal pair. The first and second differential signal pairs are arranged relative to each other in a manner to intentionally reduce or cancel crosstalk introduced by a pinout (for example, a section of a pinout, a socket, a section of a socket, a connector, a section of a connector, a socket and a connector, or a section of a socket and a connector, etc.) into at least one of the first differential signal pair and the second differential signal pair.

In some embodiments a first pinout has a pin arrangement of a plurality of differential signal pairs, and a second pinout has a pin arrangement of a plurality of differential signal pairs. The first pinout and the second pinout are near each other and the pin arrangement of the first pinout and the pin arrangement of the second pinout are arranged to reduce or cancel crosstalk According to some embodiments, crosstalk cancellation is implemented for differential pairs of a differential bus. In some embodiments, crosstalk is cancelled for a high speed serial link, a high speed serial bus, a high speed differential bus, etc. (for example, in some embodiments a bus or link such as QPI or QuickPath Interconnect, PCI Express or Peripheral Component Interconnect Express, SMI or System Management Interrupt, SATA or Serial Advanced Technology Attachment, USB or Universal Serial Bus, etc.)

For differential bus design, the differential mode of the far end crosstalk is the difference between the crosstalk picked up by the two legs of the differential pair. This can be represented with the following:

$$FEXT_{Differential} = FEXT_{Positive\_leg} - FEXT_{Negative\_leg}$$

Where $FEXT_{Differential}$ is the differential mode of the far end crosstalk, $FEXT_{positive\_leg}$ is the crosstalk picked up by one leg of the differential pair (for example, the "positive leg"), and $FEXT_{Negative\_leg}$ is the crosstalk picked up by the other leg of the differential pair (for example, the "negative leg").

According to some embodiments, a special microstrip routing is introduced immediately after or before the pinout (for example, the socket and/or connector), with a special routing arrangement so that the differential crosstalk of the microstrip cancels the differential crosstalk of socket/connector.

Figure 1:
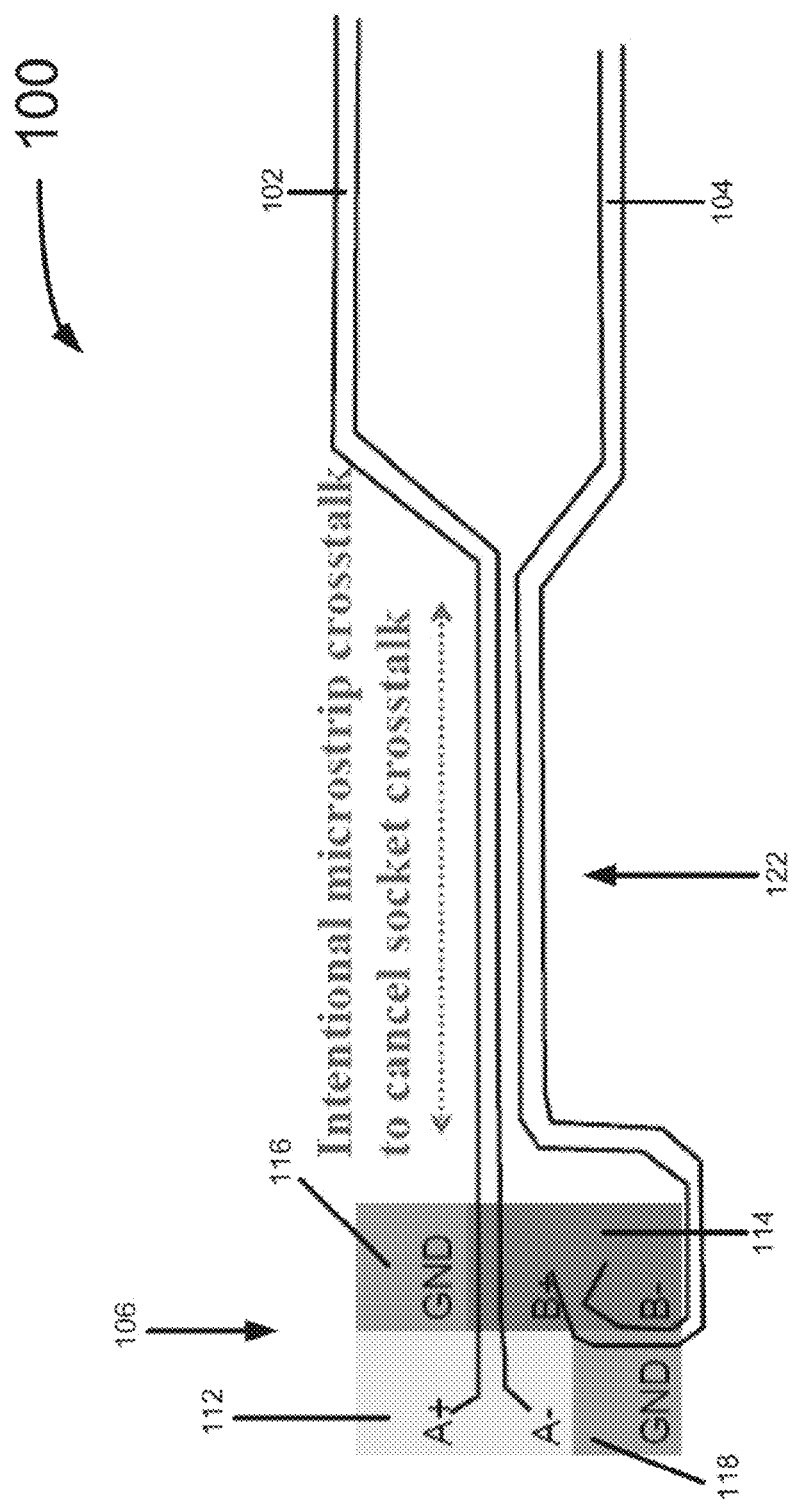
FIG. 1 illustrates a system according to some embodiments of the inventions.

FIG. 1 illustrates a system 100 according to some embodiments. System 100 includes a first differential pair 102 (A+ A−, or pair A), a second differential pair 104 (B+ B−, or pair B), and a pinout 106.

In some embodiments, pinout 106 is a section of a pinout. In some embodiments, pinout 106 represents a socket. In some embodiments, pinout 106 is a section of a pinout representing a socket. In some embodiments, pinout 106 is a connector. In some embodiments, pinout 106 is a section of the pinout representing a connector. In some embodiments, pinout 106 represents a socket and a connector. In some embodiments, pinout 106 is a section of a pinout representing a socket and a connector.

In some embodiments, pinout 106 includes pin outs 112 for the first differential pair 102, pin outs 114 for the second differential pair 104, and ground pin outs 116 and 118. It is noted that pinout 106 including pin outs 112, 114, 116 and 118 as illustrated in FIG. 1 is merely an example of some embodiments, and that there are many other pinout and pinout section implementations according to some embodiments.

In some embodiments, an intentional microstrip crosstalk is induced between a differential pair such as differential pairs 102 and 104. As illustrated in FIG. 1, intentional microstrip crosstalk is induced in an area 122 of the differential pair in order to cancel out any crosstalk induced into the differential pairs 102 and 104 by or near the pinout 106. This is accomplished by intentionally running the differential pairs 102 and 104 close to each other in area 122.

In some embodiments, the breakout arrangement of one pair of a differential pair are swapped relative to conventional differential pair implementations. For example, the B+ and B− breakout can be swapped out so that B− is brought closer to Pair A than B+.

FIG. 1 illustrates a crosstalk cancellation system according to some embodiments. In some embodiments the first differential pair 102 (Pair A) is an aggressor with regard to causing crosstalk, and the second differential pair 104 (Pair B) is a victim with regard to crosstalk. In the socket/connector pinout 112, 114, 116, 118, the step response for differential TEXT ($FEXT_{Differential}$) picked up by the second differential pair 104 (Pair B) has mostly positive values. For the microstrip routing immediately after the socket/connector 106, a special arrangement for the breakout is implemented to bring B− of Pair B 104 closer to A− and A+ of Pair A 102 in the microstrip routing section 122. This is different than traditional differential pair routing, where B+ is closer to A− and B− is further away from A−. This reversed arrangement of B+ and B− results in a negative pulse response. At the receiver side, differential pair B 104 will see a reduced total differential crosstalk.

Figure 2:
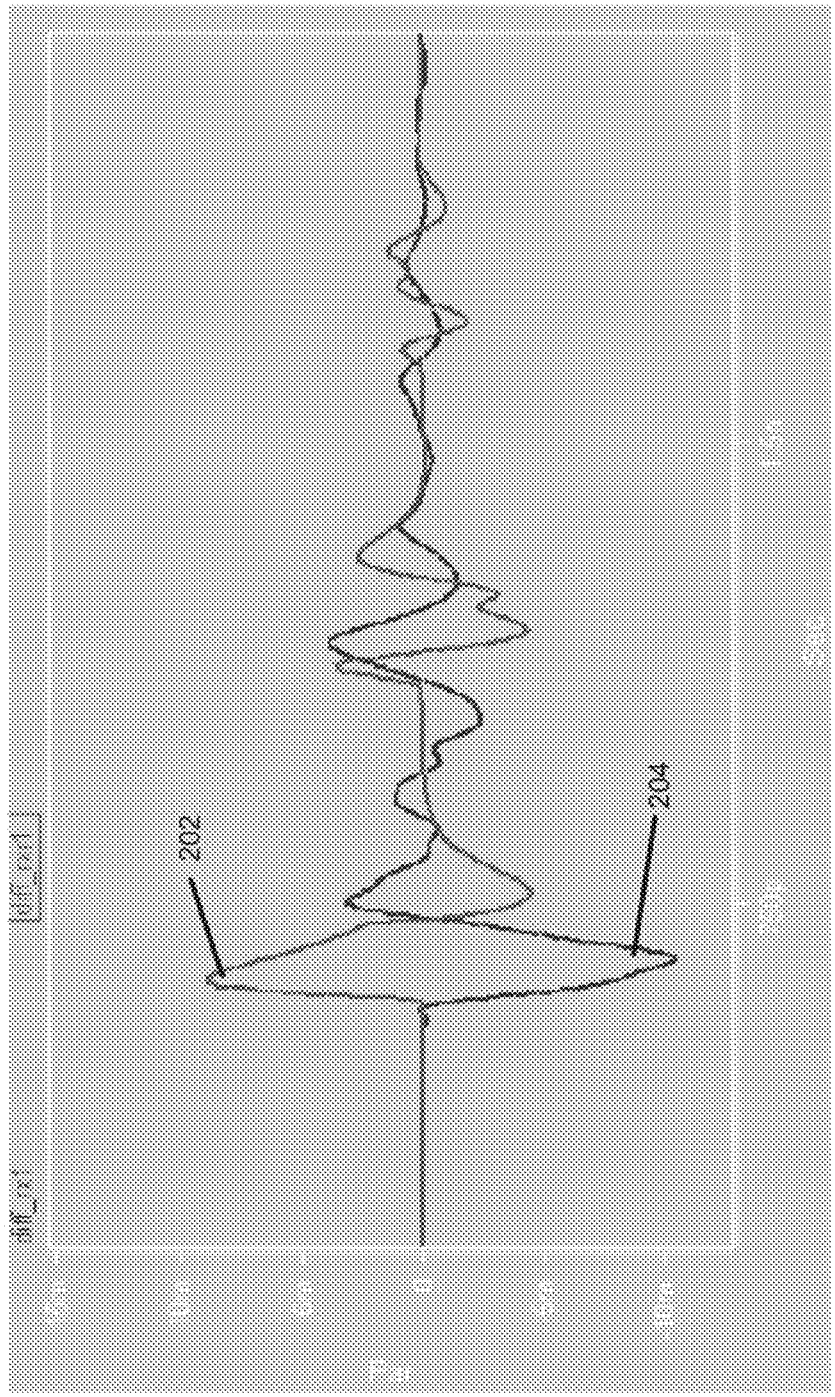
FIG. 2 illustrates a graphical representation according to some embodiments of the inventions.

FIG. 2 illustrates a graphical representation 200 according to some embodiments. In some embodiments, graphical representation 200 of FIG. 2 is based on simulation of a production LGA socket. In some embodiments, graphical representation 200 illustrates a first curve 202 and a second curve 204. In some embodiments, curve 202 illustrates a differential crosstalk contribution for an LGA socket only, and curve 204 illustrates microstrip routing only (for example, of a differential pair such as differential pair 104 in FIG. 1) with the polarity of the differential pair swapped (for example, B+ and B− swapped relative to a traditional routing arrangement).

In some embodiments, in the socket/connector pin-out, the step response for differential FEXT ($FEXT_{Differential}$) picked up by Pair B has mostly positive values, as shown in curve 202 in FIG. 2.

For the microstrip routing, immediately after the socket/connector, a special arrangement for the breakout is implemented according to some embodiments to bring B− closer to Pair A for the microstrip routing section, (while in traditional routing, B+ is closer to A−). This results in a negative pulse response, as shown in curve 204 in FIG. 2. At the receiver side, differential pair B will see a reduced total differential crosstalk according to some embodiments.

Figure 3:
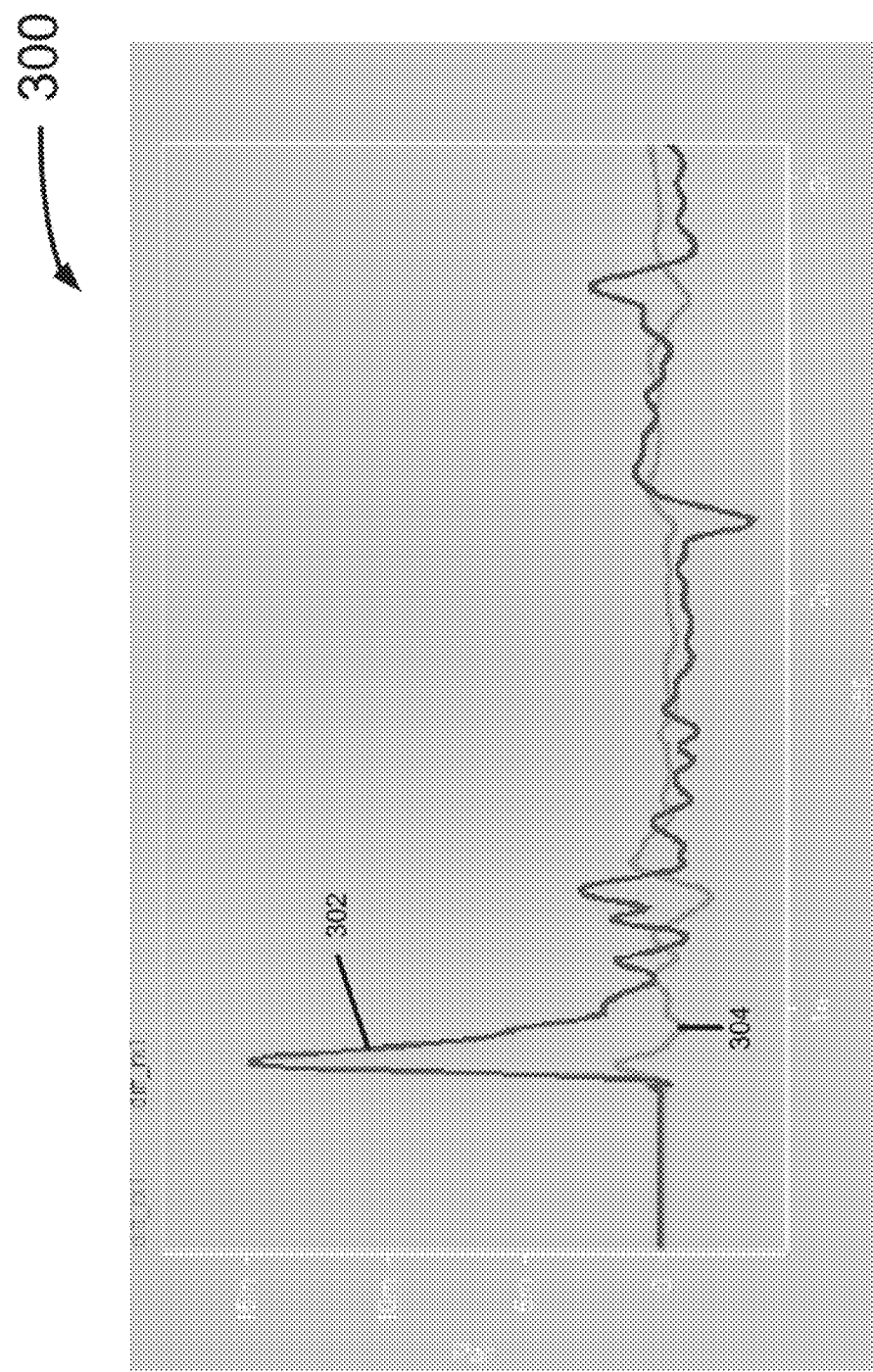
FIG. 3 illustrates a graphical representation according to some embodiments of the inventions.

FIG. 3 illustrates a graphical representation 300 according to some embodiments. In some embodiments, graphical representation 300 of FIG. 3 is based on simulation of a full link crosstalk. In some embodiments, graphical representation 300 illustrates a first curve 302 and a second curve 304. In some embodiments, curve 302 illustrates a simulated full link differential crosstalk with a typical arrangement of the differential pairs. In some embodiments, curve 304 illustrates a simulated full link differential crosstalk with a crosstalk cancellation arrangement of the differential pairs according to some embodiments.

In some embodiments, FIG. 3 illustrates the simulated crosstalk level at the receiver end, for a topology with typical package routing, an LGA socket, and 6 inches of PCB routing. The curve 302 represents the current solution (without crosstalk cancellation), and the curve 304 represents the crosstalk level with the implementation illustrated in FIG. 1, for example. In some embodiments, curve 304 of FIG. 3 illustrates an implementation with 2 inches of close coupled microstrip routing that is introduced to cancel the socket crosstalk level (for example, in area 122 of FIG. 1), while the other 4 inches of routing is un-coupled. The crosstalk level dropped dramatically from 15 mv down to 2 mv peak value when the implementation of FIG. 1 was simulated as illustrated by curves 302 and 304 in FIG. 3.

In some embodiments, the distance between the differential pairs, the coupling length (and/or the length of the microstip of the differential pairs in which crosstalk is intentionally inserted into the pairs) can be changed to optimize the solution. For example, simulation and/or measurement can be used to determine how close the differential pairs can be to each other for the microstrip routing, and to determine the optimal coupling length.

Some embodiments have been described herein in which the first differential pair A is the aggressor with regard to crosstalk. However, due to reciprocity, it is noted that differential pair A will observe the same crosstalk cancellation benefit when differential pair B is the aggressor. It is also noted that in some embodiments similar results will occur if the pair A routings A+ and A− are reversed relative to the typical previous implementation rather than reversing the pair B routings B+ and B−.

In some embodiments, the crosstalk for a differential bus is reduced, and the eye opening at receiver is improved. This allows for a lower-cost socket/connector component, and/or for increased routing length of the differential bus.

In some embodiments, an intentional microstrip routing section cancels out most or all socket/connector crosstalk.

In some embodiments, a special breakout arrangement brings the B− signal closer to the differential Pair A, so that B− can pick up more crosstalk than B+.

In some embodiments, simulation/measurement based analysis is used to determine the crosstalk amount of the microstrip pair, for optimal cancellation of the socket/connector socket crosstalk.

In some embodiments, the overall crosstalk level is reduced for a high speed differential link, and link performance is increased.

As discussed herein, crosstalk has become a critical limitation for high speed serial IO (Input/Output) performance. The vertical interconnect (such as a socket and a connector) has become one of the most dominant crosstalk contributors in production. Therefore, according to some embodiments, a special pin-out assignment is used to cancel the differential far end crosstalk for systems with two connector or two socket topology, for example.

As further discussed herein, for differential bus design, the differential mode of the far end crosstalk is the difference between the crosstalk picked up by the two legs of the differential pair, as represented by the following:

$$FEXT_{Differential} = FEXT_{Positive\_leg} - FEXT_{Negative\_leg}.$$

Where $FEXT_{Differential}$ is the differential mode of the far end crosstalk, $FEXT_{Positive\_leg}$ is the crosstalk picked up by one leg of the differential pair (for example, the "positive leg"), and $FEXT_{Negative\_leg}$ is the crosstalk picked up by the other leg of the differential pair (for example, the "negative leg").

In some embodiments, for example, in systems with topologies that the high speed differential link has to go through two connectors or sockets, the pin-out can be assigned in a special way, so that the crosstalk contribution of the two connectors or sockets can cancel each other.

Figure 4:
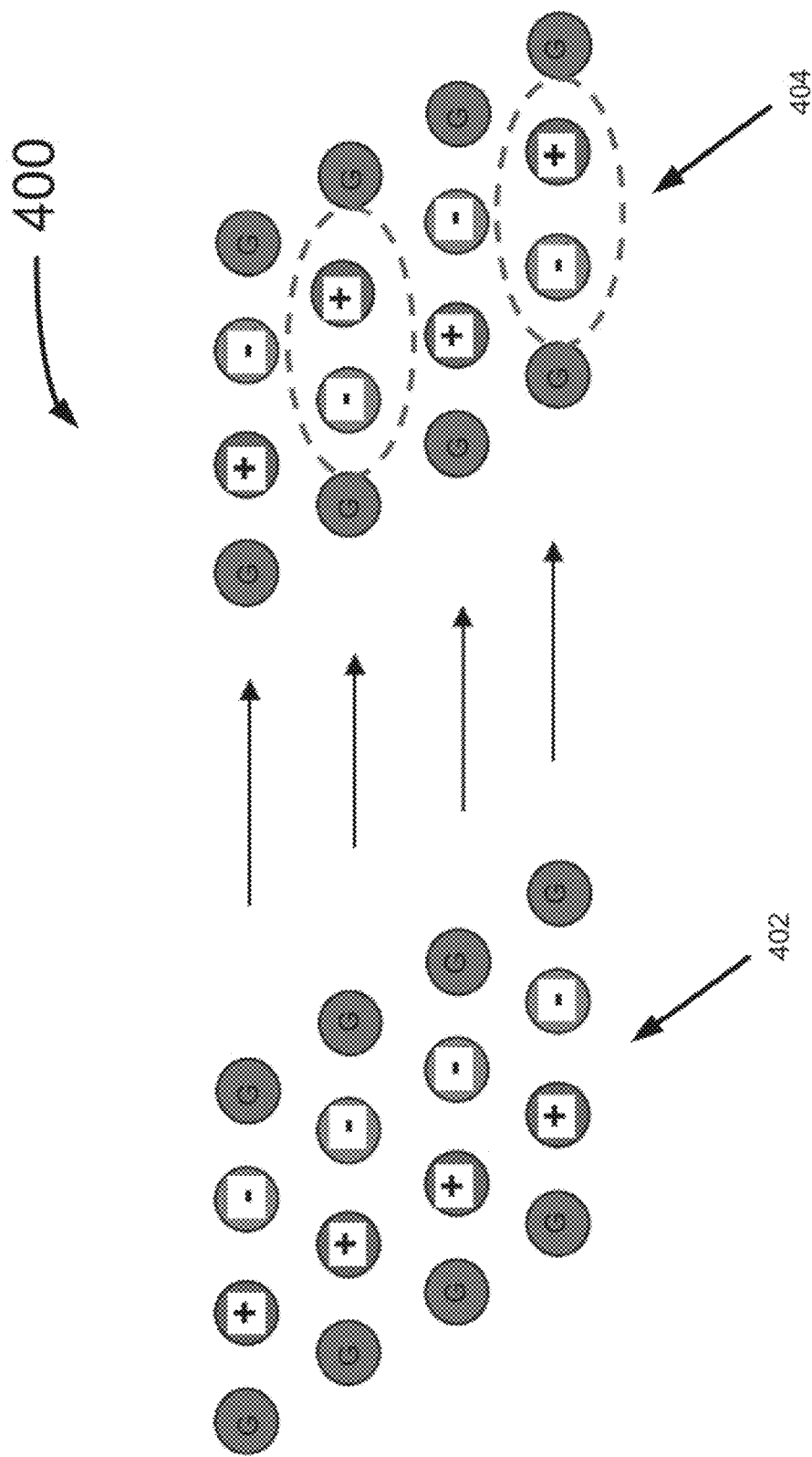
FIG. 4 illustrates a system according to some embodiments of the inventions.

FIG. 4 illustrates a system 400 according to some embodiments. In some embodiments, system 400 includes a pin arrangement (or pin-out arrangement) 402 for a first pinout (for example, in some embodiments, a socket link including differential pairs), and a pin arrangement (or pin-out arrangement) 404 for a second pinout (for example, in some embodiments, a socket link including differential pairs). The positive (+) pin of each differential pair is illustrated with a "+" (plus sign) and the negative (−) pin of each differential pair is illustrated with a "−" (minus sign). The ground pins are illustrated with a "G".

In some embodiments, FIG. 4 illustrates a pin-out arrangement for a small section of a two-socket link (sockets 402 and 404). One socket 404 of the two sockets 402 and 404 in the link has the positive and negative pin (P & N or + & −) swapped for every other differential pair. The positive and negative pins that are swapped are shown in circled dotted lines in FIG. 4. The routing connection in FIG. 4 is shown as the arrows indicate, which is a typical scenario. The crosstalk picked up by any victim signal will have opposition polarity at the first socket 402 vs at the second socket 404, and thus the crosstalk will cancel each other. Although FIG. 4 is illustrated with each differential pair (+ and −) having two ground pins (G) next to them, other embodiments work in a similar manner regardless of the ground pin assignments, and ground pins are arranged differently in some embodiments.

Figure 5:
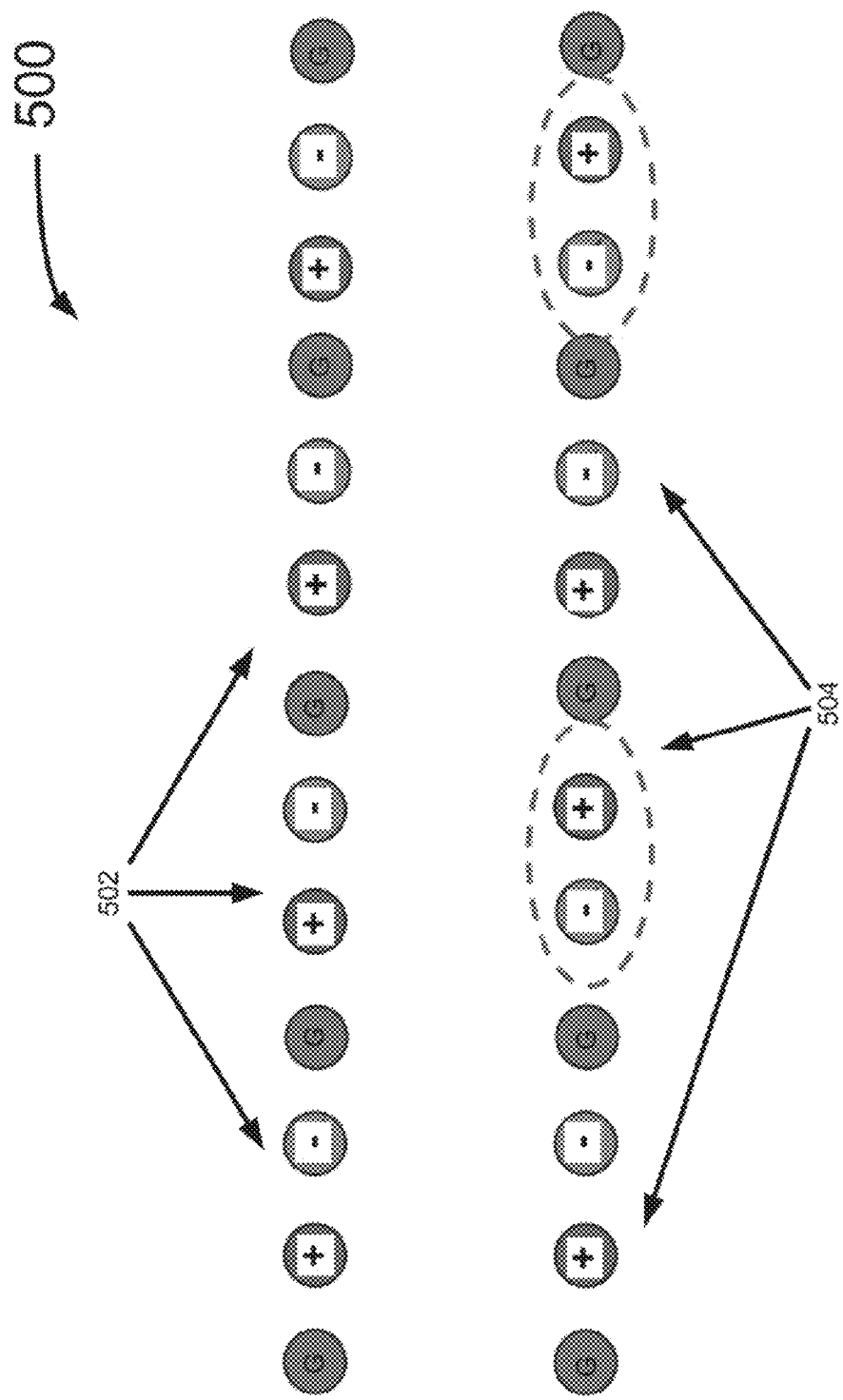
FIG. 5 illustrates a system according to some embodiments of the inventions.

FIG. 5 illustrates a system 500 according to some embodiments. In some embodiments, system 500 includes a pin arrangement (or pin-out arrangement) 502 for a first pinout (for example, according to some embodiments a connector including differential pairs) (illustrated in a first top row), and a pin-out arrangement 504 for a second connector including differential pairs (illustrated in a second bottom row). The positive (+) pin of each differential pair is illustrated with a "+" (plus sign) and the negative (−) pin of each differential pair is illustrated with a "−" (minus sign). The ground pins are illustrated with a "G".

In some embodiments, FIG. 5 illustrates a pin-out arrangement for differential links with two connectors (connectors 502 and 504) according to some embodiments. In some embodiments, one connector 504 of the two connectors 502 and 504 has the positive and negative pin (P & N or + & −) swapped for every other differential pair. The positive and negative pins that are swapped are shown in circled dotted lines in FIG. 5.

Although FIG. 5 is illustrated with each differential pair (+ and −) having two ground pins (G) next to them, other embodiments work in a similar manner regardless of the ground pin assignments, and ground pins are arranged differently in some embodiments.

In some embodiments, FIG. 5 illustrates a similar implementation for a typical connector pin out. In this case, it assumes that the dominant crosstalk aggressor is between two pairs in the same row (which is the case for most QuickPath Interconnect and PCI Express connectors).

In some embodiments including connectors whose dominant crosstalk is not in the same row, the same idea is implemented by swapping the positive and negative (P & N or + & −) pin-out for the most dominant aggressor at the connector (for example, the second connector in FIG. 5).

Figure 6:
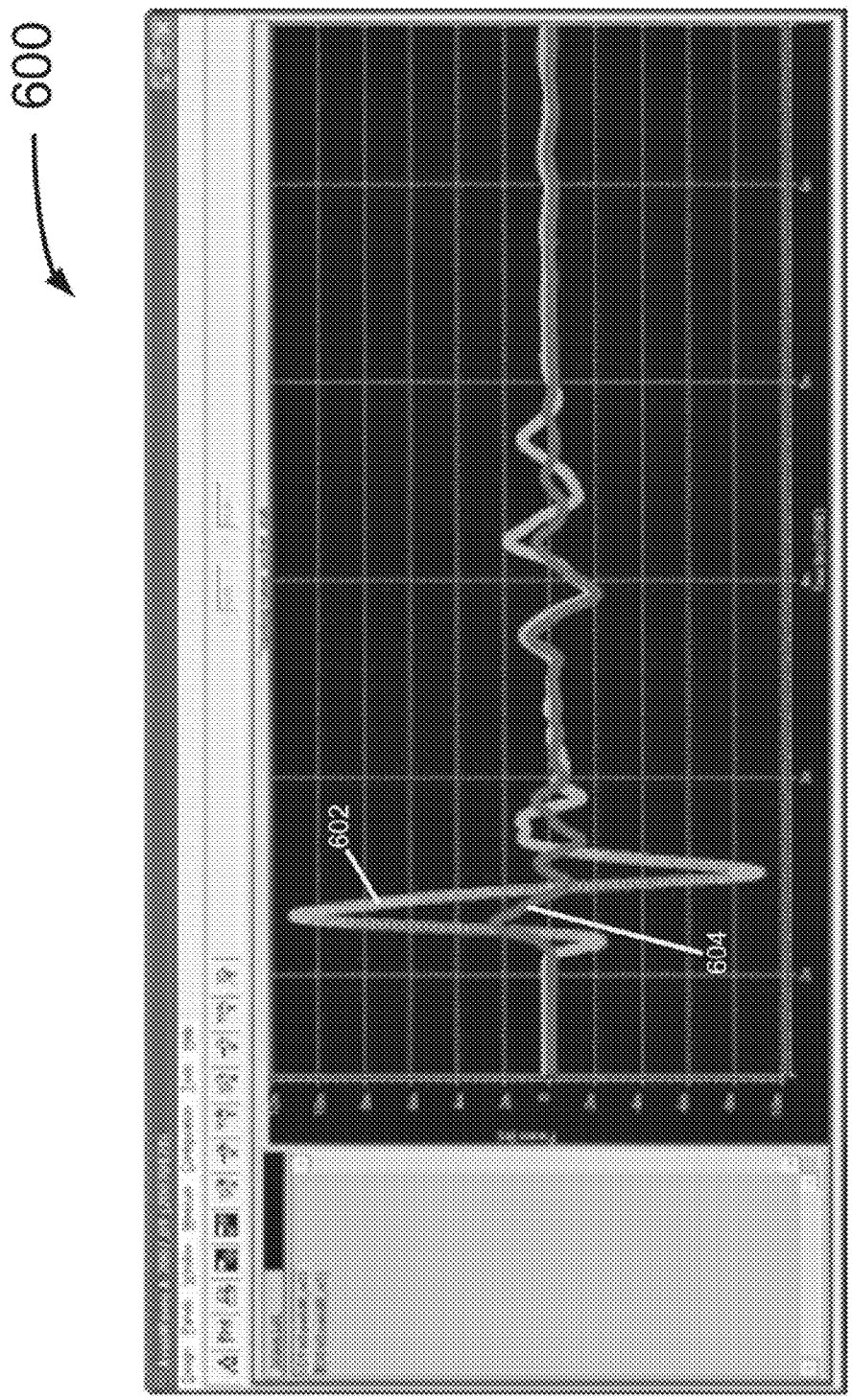
FIG. 6 illustrates a graphical representation according to some embodiments of the inventions.

FIG. 6 illustrates a graphical representation 600 according to some embodiments. In some embodiments, graphical representation 600 of FIG. 6 is based on simulation of a full link crosstalk. In some embodiments, graphical representation 600 illustrates a first curve 602 and a second curve 604. In some embodiments, curve 602 illustrates a simulated full link differential crosstalk with a typical arrangement of the pin-outs on the connector and/or socket. In some embodiments, curve 604 illustrates a simulated full link differential crosstalk with a crosstalk cancellation arrangement of the pin-outs according to some embodiments.

In some embodiments, FIG. 6 illustrates an exemplary simulated crosstalk level (pulse response) with and without the crosstalk cancellation pin-out for a 17 inch QuickPath Interconnect link (QPI link) at 6.4 Gbps with two sockets. Without crosstalk cancellation pin-out implementations according to some embodiments, the crosstalk level is at approximately 20 mv peak-to-peak as illustrated by curve 602 in FIG. 6. When using crosstalk cancellation pin-out implementations according to some embodiments (for example, as in system 400 of FIG. 4 or system 500 of FIG. 5, the level is reduced to approximately 4 mv as illustrated by curve 604 in FIG. 6.

It is noted that the simulation results illustrated herein by the graphical representation 200 in FIG. 2, the graphical representation 300 in FIG. 3, and the graphical representation 600 in FIG. 6, for example, illustrate results of specific simulations according to some embodiments. Other embodiments may show different simulation results, and the simulation results illustrated and discussed herein are not intended to limit the various embodiments of the inventions.

According to some embodiments, crosstalk cancellation works well when two sockets (and/or connectors) have an identical or similar amount of crosstalk. If two different types of socket (and/or connector) are used, the effectiveness may be reduced in some embodiments.

According to some embodiments, crosstalk cancellation works well when the routing length of aggressor and victim pairs between two sockets (and/or connectors) is identical or close. In some embodiments, crosstalk cancellation remains effective as flight time differences are less than 1 Unit Interval (UI) for example, where 1 Unit interval is defined as a time interval for one bit of data transmission.

According to some embodiments, crosstalk cancellation in a typical server design works very well, since the same sockets and same connectors are typically used for high speed differential links in the same system. Additionally, the routing length difference between aggressor and victim pairs is typically small enough due to their proximity to each other.

In some embodiments, specific pin-out assignments are used to enforce a crosstalk polarity change for one of the two sockets (and/or connectors). This results in crosstalk cancellation for the full link, and improves the full link performance.

In some embodiments, a specific pin-out assignment is used to swap the positive and negative (P & N or + & −) pins for every other pair of the differential link at one of the two sockets (or connectors). This enforces a crosstalk cancellation, and results in better full link performance.

In some embodiments, crosstalk cancellation is implemented to reduce the overall crosstalk level for one or more high speed differential links, and also to increase link performance (for example, a larger eye opening, or a longer routing length). This is done according to some embodiments without increasing BOM (Bill of Materials) cost.

Some embodiments are described herein as cancelling and/or reducing crosstalk. According to some embodiments, crosstalk can be cancelled or reduced (for example, reduced to an acceptable level), and may not always be completely cancelled (for example, when they are "cancelled" or reduced to an acceptable level).

Although some embodiments have been described herein as being related to a particular implementation or technology, according to some embodiments these particular implementations or technologies may not be required.

Although some embodiments have been described in reference to particular implementations, other implementations are possible according to some embodiments. Additionally, the arrangement and/or order of circuit elements or other features illustrated in the drawings and/or described herein need not be arranged in the particular way illustrated and described. Many other arrangements are possible according to some embodiments.

In each system shown in a figure, the elements in some cases may each have a same reference number or a different reference number to suggest that the elements represented could be different and/or similar. However, an element may be flexible enough to have different implementations and work with some or all of the systems shown or described herein. The various elements shown in the figures may be the same or different. Which one is referred to as a first element and which is called a second element is arbitrary.

In the description and claims, the terms "coupled" and "connected," along with their derivatives, may be used. It should be understood that these terms are not intended as synonyms for each other. Rather, in particular embodiments, "connected" may be used to indicate that two or more elements are in direct physical or electrical contact with each other. "Coupled" may mean that two or more elements are in direct physical or electrical contact. However, "coupled" may also mean that two or more elements are not in direct contact with each other, but yet still co-operate or interact with each other.

An algorithm is here, and generally, considered to be a self-consistent sequence of acts or operations leading to a desired result. These include physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers or the like. It should be understood, however, that all of these and similar terms are to be associated with the appropriate physical quantities and are merely convenient labels applied to these quantities.

Some embodiments may be implemented in one or a combination of hardware, firmware, and software. Some embodiments may also be implemented as instructions stored on a machine-readable medium, which may be read and executed by a computing platform to perform the operations described herein. A machine-readable medium may include any mechanism for storing or transmitting information in a form readable by a machine (e.g., a computer). For example, a machine-readable medium may include read only memory (ROM); random access memory (RAM); magnetic disk storage media; optical storage media; flash memory devices; electrical, optical, acoustical or other form of propagated signals (e.g., carrier waves, infrared signals, digital signals, the interfaces that transmit and/or receive signals, etc.), and others.

An embodiment is an implementation or example of the inventions. Reference in the specification to "an embodiment," "one embodiment," "some embodiments," or "other embodiments" means that a particular feature, structure, or characteristic described in connection with the embodiments is included in at least some embodiments, but not necessarily all embodiments, of the inventions. The various appearances "an embodiment," "one embodiment," or "some embodiments" are not necessarily all referring to the same embodiments.

Not all components, features, structures, characteristics, etc. described and illustrated herein need be included in a particular embodiment or embodiments. If the specification states a component, feature, structure, or characteristic "may", "might", "can" or "could" be included, for example, that particular component, feature, structure, or characteristic is not required to be included. If the specification or claim refers to "a" or "an" element, that does not mean there is only one of the element. If the specification or claims refer to "an additional" element, that does not preclude there being more than one of the additional element.

Although flow diagrams and/or state diagrams may have been used herein to describe embodiments, the inventions are not limited to those diagrams or to corresponding descriptions herein. For example, flow need not move through each illustrated box or state or in exactly the same order as illustrated and described herein.

The inventions are not restricted to the particular details listed herein. Indeed, those skilled in the art having the benefit of this disclosure will appreciate that many other variations from the foregoing description and drawings may be made within the scope of the present inventions. Accordingly, it is the following claims including any amendments thereto that define the scope of the inventions.

What is claimed is:

1. An apparatus comprising:
a pinout having pins;
a first microstrip differential signal pair; and
a second microstrip differential signal pair;
wherein the first microstrip differential signal pair and the second microstrip differential signal pair are connected to the pins and routed immediately after the pinout in a routing section,
and wherein the second microstrip differential signal pair is routed around the pinout to reverse polarities and brought closer to the first microstrip differential signal pair in the routing section to reduce crosstalk introduced to the second microstrip differential signal pair by the pinout,
and wherein signal lines of opposing polarity of the first microstrip differential signal pair and the second microstrip differential signal pair are arranged closest to each other in the pinout,
and wherein signal lines of a same polarity of the first microstrip differential signal pair and the second microstrip differential signal pair are arranged closest to each other in the routing section.

2. The apparatus of claim 1, comprising microstrips of the first microstrip differential signal pair and the second microstrip differential signal pair that are routed near each other for specified portions of their lengths in an area near the pinout.

3. The apparatus of claim 2, wherein the specified portions are just after the pinout.

4. The apparatus of claim 2, wherein the specified portions are just before the pinout.

5. The apparatus of claim 1, further comprising microstrip routing near each other for the first microstrip differential signal pair and the second microstrip differential signal pair in an area near the pinout.

6. The apparatus of claim 1, further comprising routing in an area near the pinout a negative polarity signal of the first microstrip differential signal pair and a negative polarity signal of the second microstrip differential signal pair nearer to each other than any other signals of the first microstrip differential signal pair and the second microstrip differential signal pair.

7. The apparatus of claim 1, further comprising routing in an area near the pinout a positive polarity signal of the first microstrip differential signal pair and a positive polarity signal of the second microstrip differential signal pair nearer to each other than any other signals of the first microstrip differential signal pair and the second microstrip differential signal pair.

8. The apparatus of claim 1, wherein the first microstrip differential signal pair and the second microstrip differential signal pair comprise high-speed, serial links.

9. The apparatus of claim 1, further comprising, in an area near the pinout, positions of negative and positive polarity signals of the first microstrip differential signal pair reversed.

10. The apparatus of claim 1, wherein in an area near the pinout the negative polarity signal of the first microstrip differential signal pair is closer to the second microstrip differential signal pair than the positive polarity signal of the first microstrip differential signal pair, and wherein the negative polarity signal of the second microstrip differential signal pair is closer to the first microstrip differential signal pair than the positive polarity signal of the second microstrip differential signal pair.

11. The apparatus of claim 1, wherein in an area near the pinout the positive polarity signal of the first microstrip differential signal pair is closer to the second microstrip differential signal pair than the negative polarity signal of the first microstrip differential signal pair, and wherein the positive polarity signal of the second microstrip differential signal pair is closer to the first microstrip differential signal pair than the negative polarity signal of the second microstrip differential signal pair.

12. The apparatus of claim 1, further comprising a pin arrangement of a positive and a negative signal of a differential signal pair reversed on an additional pinout for one or more differential signal pairs on the additional pinout.

13. The apparatus of claim 1, further comprising a pin arrangement of a positive and a negative signal of a differential signal pair reversed on a first pinout for one or more differential signal pairs on the connector relative to a corresponding near pin arrangement of a positive and a negative signal of a differential signal pair on a second pinout.

14. The apparatus of claim 1, wherein the crosstalk is cancelled or reduced to an acceptable level.

15. The apparatus of claim 1, wherein the pinout is a section of a pinout.

16. The apparatus of claim 1, wherein the pinout is at least one of a connector, a socket, a section of a connector, a section of the socket, the connector and the socket, or a section of the connector and the socket.

17. An apparatus comprising:
a first pinout having a pin arrangement of a first plurality of microstrip differential signal pairs; and
a second pinout having a pin arrangement of a second plurality of microstrip differential signal pairs;
wherein the first pinout and the second pinout are routed immediately after a third pinout in a routing section,
and wherein the second pinout is routed around the third pinout to reverse polarities and brought closer to the first pinout in the routing section to reduce crosstalk introduced to the second pinout by the third pinout,
and wherein signal lines of opposing polarity of the first pinout and the second pinout are arranged closest to each other in the third pinout,
and wherein signal lines of a same polarity of the first pinout and the second pinout are arranged closest to each other in the routing section.

18. The apparatus of claim 17, wherein a pin arrangement of a positive and a negative signal on one of the first plurality of microstrip differential signal pairs are reversed relative to a corresponding near pin arrangement of a positive and a negative signal of one of the second plurality of microstrip differential signal pairs.

19. The apparatus of claim 17, wherein the first and second plurality of microstrip differential signal pairs comprise high-speed, serial links.

20. The apparatus of claim 17, wherein the crosstalk is reduced to a predetermined threshold.

21. The apparatus of claim 17, wherein the first pinout is a section of a fourth pinout.

22. The apparatus of claim 17, wherein the first pinout is at least one of a connector, a socket, a section of the connector, a section of the socket, the connector and the socket, or a section of the connector and the socket.

* * * * *